United States Patent
Wagner et al.

(10) Patent No.: US 7,294,814 B2
(45) Date of Patent: *Nov. 13, 2007

(54) MICROLITHOGRAPHY PROJECTION OBJECTIVE INCLUDING DEFORMABLE MIRROR WITH ADJUSTING ELEMENTS AND SYSTEMS AND METHODS USING THE SAME

(75) Inventors: Cristian Wagner, Aalen (DE); Michael Gerhard, Aalen (DE); Gerald Richter, Abtsgmünd (DE)

(73) Assignee: Carl Zeiss SMT AG, Oberkochen ( * ) Notice: Subject to any disclaimer, the term of this patent is extended or adjusted under 35 U.S.C. 154(b) by 0 days.

This patent is subject to a terminal disclaimer.

(21) Appl. No.: 11/533,632

(22) Filed: Sep. 20, 2006

(65) Prior Publication Data

US 2007/0012871 A1    Jan. 18, 2007

Related U.S. Application Data

(63) Continuation of application No. 10/759,964, filed on Jan. 17, 2004, now Pat. No. 7,112,772, which is a continuation-in-part of application No. 09/321,908, filed on May 28, 1999, now abandoned.

(30) Foreign Application Priority Data

May 29, 1998    (DE) ................. 198 24 030

(51) Int. Cl.
*G01J 1/20*    (2006.01)
*G02B 5/08*    (2006.01)

(52) U.S. Cl. ............... 250/201.9; 359/849

(58) Field of Classification Search ............ 250/216, 250/201.9, 548; 359/846–849
See application file for complete search history.

(56) References Cited

U.S. PATENT DOCUMENTS

| | | | |
|---|---|---|---|
| 3,893,755 A | 7/1975 | Cobarg et al. | 359/847 |
| 4,043,644 A | 8/1977 | Humphrey | 359/846 |
| 4,119,366 A | 10/1978 | Lemaitre | 359/847 |
| 4,393,303 A | 7/1983 | Spinhirne | 250/201.9 |
| 4,408,874 A * | 10/1983 | Zinky et al. | 355/52 |
| 4,461,398 A | 7/1984 | Argy | 220/560.06 |
| 4,647,164 A | 3/1987 | Sawicki et al. | 359/849 |
| 4,655,563 A | 4/1987 | Plante et al. | 359/849 |
| 4,993,823 A | 2/1991 | Schaffer, Jr. et al. | 359/849 |
| 5,052,763 A | 10/1991 | Singh et al. | 359/355 |
| 5,089,915 A | 2/1992 | Gobeli | 359/846 |
| 5,142,132 A | 8/1992 | MacDonald et al. | 250/201.9 |
| 5,563,684 A * | 10/1996 | Stagaman | 355/72 |
| 5,793,473 A | 8/1998 | Koyama et al. | 355/55 |
| 5,798,878 A | 8/1998 | Asari et al. | 359/846 |
| 5,805,273 A | 9/1998 | Unno | 355/30 |

(Continued)

FOREIGN PATENT DOCUMENTS

| | | |
|---|---|---|
| DE | 196 16 922.4 | 4/1996 |
| EP | 0 744 641 B1 | 9/2001 |
| JP | 08-55789 | 6/1994 |
| WO | 93/22711 | 11/1993 |

*Primary Examiner*—Thanh X. Luu
(74) *Attorney, Agent, or Firm*—Fish & Richardson P.C.

(57) ABSTRACT

A catadioptric projection objective for microlithography has at least one curved mirror that is deformable and adjusting elements that can deform the deformable mirror. The adjusting elements are matched to given image errors and their correction. The invention is suitable for astigmatism, four-fold wavefront-deformations due to lens heating, compaction, and the like.

41 Claims, 2 Drawing Sheets

U.S. PATENT DOCUMENTS 5,880,891 A   3/1999  Furter ........................ 359/651

5,963,374 A   10/1999  Endou et al. ............... 359/641

* cited by examiner

MICROLITHOGRAPHY PROJECTION OBJECTIVE INCLUDING DEFORMABLE MIRROR WITH ADJUSTING ELEMENTS AND SYSTEMS AND METHODS USING THE SAME

CROSS-REFERENCES TO RELATED APPLICATIONS

This application is a Continuation of U.S. patent application Ser. No. 10/759,964, filed Jan. 17, 2004, now U.S. Pat. No. 7,112,772 which is a Continuation-in-Part of U.S. patent application 09/321,908 filed May 28, 1999 of the same inventors, now abandoned, which claims priority to German Patent Application No. 198 24 030.9, filed May 29, 1998. The entire contents of U.S. patent application Ser. No. 10/759,964 is hereby incorporated by reference herein.

STATEMENT REGARDING FEDERALLY SPONSORED RESEARCH OR DEVELOPMENT

Not applicable.

BACKGROUND OF THE INVENTION

1. Field of the Invention

The invention relates to a catadioptric projection objective for microlithography, with at least one curved mirror, and an operating process that increases image quality of such an objective 2. Discussion of Relevant Art U.S. Pat. No. 5,142,132 describes a wafer stepper with an objective of this field and a planar mirror that can be deformed by an x-y array of actuators in order to correct optical errors. As large as possible a number of actuators for respectively a smallest possible portion of the mirror is described as advantageous. The adjustable mirror is driven at a large angle of reflection so that its effects are severely asymmetrical.

Projection objectives for microlithography having elements whose position can be varied (z-drive) or with change of the optical path by change of pressure or of the composition of the filling gas are known in different variants with many kinds of control circuits. Purely refractive objectives are described here as a rule.

European Patent EP 0 660 169 describes a refractive projection objective for microlithography with correction by rotation of cylindrical lenses of errors that are not rotationally symmetrical. Citations relating to longitudinally displaceable lenses are also described.

Catadioptric projection objectives with a curved mirror and a polarization beam splitter are known, e.g. from German Patent DE 196 16 922.4 (U.S. patent application Ser. No. 08/845,384 filed Apr. 15, 1997) and the citations given therein. The content of this patent application is incorporated herein by reference.

Other catadioptric projection objectives are likewise known, e.g., those of the type of the modified Schupman achromats, also termed H-design, and described, e.g., in U.S. Pat. No. 5,052,763.

SUMMARY OF THE INVENTION

The invention has as its object the provision of a catadioptric reduction objective that with the simplest construction nevertheless pets an effective control and regulation of the imaging quality, particularly as regards variable disturbances. A further object of the invention is corresponding operating methods for a projection exposure device.

This object is attained by a catadioptric projection objective having at least one curved mirror that is deformable and adjusting elements that deform the curved mirror, in which the adjusting elements are matched to given image errors and their correction.

The adjustment of a curved mirror, which is already effectively in the basic position for image formation, is common to all the embodiments, with few actuators, which are appropriately arranged for the required deformation of the mirror.

The number of components and the assembly and control costs are considerably reduced, and the required shape corrections can be set more correctly to shape the with an unspecific actuator array.

The operating process according to the invention solves the object of providing a corresponding process, and puts in concrete terms at most eight contact places (that is, four for zones C; up to four for zones B) of the adjustment device.

The operating process describes the preferably sensed and corrected image errors, wherein the measurement is provided in the region of the image plane, during the exposure or alternating with it.

The sensing of the operating parameters of the projection exposure device or of the properties of the mask, is provided as a parameter for control of the deformation. The associated shape settings can be established in construction, or in the calibration of the system.

Further, lenses, mask and/or wafer may be displaced in order to improve imaging quality.

The invention is thus primarily concerned with the correction of errors that are not distributed rotationally symmetrically, but also not arbitrarily, by means of a mirror deformation which is correspondingly non-rotationally symmetrical. This is just what is expedient for the correction of the non-rotationally symmetrical lens deformations that arise in wafer scanners with a narrow rectangular image field.

BRIEF DESCRIPTION OF THE DRAWINGS

The invention will be described in more detail with reference to the drawings, in which.

DETAILED DESCRIPTION OF THE INVENTION

Figures 1, 2:
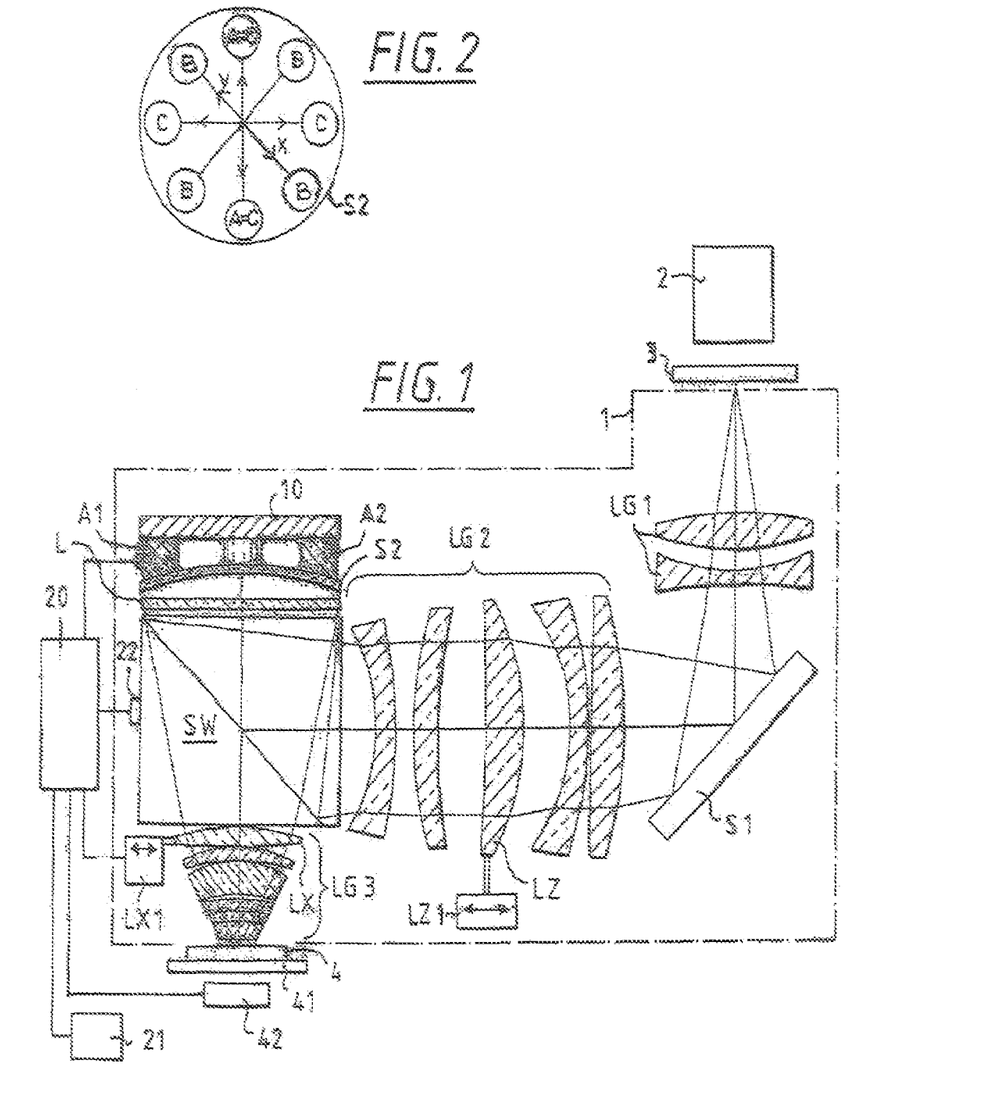
FIG. 1 shows schematically a projection exposure device with catadioptric reduction objective and adaptive mirror.
FIG. 2 shows schematically an arrangement of actuators (up to eight contact places—four for zones C and up to four for zones B) and the adaptive mirror.

The core component of the catadioptric projection exposure device according to FIG. 1 is the catadioptric reduction objective 1, in the example shown the embodiment according to FIG. 1 and Table 1 of German Patent Application DE 196 16 922.4 (U.S. patent application Ser. No. 08/845,384), which is incorporated herein by reference.

This catadioptric reduction objective 1 includes a first lens group LG1, a plane deflecting mirror S1, a second lens group LG2, a beam splitter cube SW, a quarter wave plate L, a curved mirror S2 and a third lens group LG3. An illuminating device 2, a mask 3 and a wafer 4 in a holder 41 (wafer chuck) complete the projection exposure device, which is to this extent conventional.

The curved mirror S2 is newly embodied as an adaptive mirror. Actuators A1, A2 and a frame 10 are provided for is purpose. A sensor 42, e.g., a wavefront sensor, is provided in the region of the wafer 4, and measures a parameter for the imaging quality during exposure of the wafer or in pauses when the wafer 4 is removed from the beam path.

A control unit 20, preferably a functional unit of a computer which also undertakes other control tasks of the wafer-stepper or wafer-scanner, uses its signals and possibly those of another sensor 21, for example for air pressure and the temperature of the surroundings, or a sensor 22 for the temperature of the beam splitter prism SW, for driving the actuators A1, A2 and thus for control of the imaging quality.

Axially displaceable lenses, here a lens LZ of a second lens group LG2, and/or radially displaceable lenses, here a lens LX, are provided and are controlled by the control unit 20 by means of adjusting members LX, LX1.

Due to the use of progressively shorter wavelengths in semiconductor lithography, various time-dependent material effects arise that sensitively affect the imaging quality of the exposure optics. The heating of lens groups due to the increased absorption has to be mentioned here, the effect of which is so strong that the resulting image errors, including their variation with time, have to be measured or simulated, and compensated by means of a control loop. It has been found that for wavelengths below 248 nm the absorption increases in dependence on the intensity and duration of irradiation. The increase of absorption (induced absorption) leads to an additional lens heating, which has to be compensated as above. A further effect is a continuous increase of the refractive index, which proceeds with a shrinkage of the material. This effect also is radiation dependent, and is termed "compaction". Here also there is a requirement for a dynamic correction of the image errors, based on a long time scale but however quasi-static. Particularly large image errors arise due to lens heating in a catadioptric design that contains a beam splitter cube SW. According to the present state of the art, an active correction of pupil errors is required for such a design.

An adaptive mirror S2 is therefore disclosed, which is equipped with suitable possibilities of manipulation A1, A2 in order to compensate these image errors, which are dependent on material and process, during the operation: of the objective 1 and thus to insure the imaging quality of the objective 1. The adaptive mirror S2 is necessary in order to compensate certain image errors, such as the astigmatism on the axis, when otherwise only spherical centered elements are used.

This can be generalized to all catadioptric designs which contain a mirror which provides an image. For all these systems, particularly with the use of a slit-shaped image field (scanner), the heating of the objective is not rotationally symmetrical, so that an astigmatism arises on the axis.

Altogether, the main image errors that arise due to lens heating and also as a result of "induced" absorption and due to compaction of the beam splitter cube, are (typical values in parentheses):

(a1) astigmatism on the axis (150 nm)
(b1) coma on the axis (20 nm)
(c1) altered focal length (1 μm)
(d1) image field displacement (transverse) (100 nm)
(e1) scale errors (1-5 ppm)
(f1) image shell (50 nm)

(g1) fourfold wavefront-deformation (higher order image error of fourfold symmetry around the optical axis) as a pupil error
(h1) spherical aberration as a pupil error.

These errors reach a stationary state in the course of several hours, and therefore have to be responded to relatively slowly.

Since a scanner system is concerned, the image field is slit-shaped (e.g. 8 mm×25 mm). Strongly elliptical distributions of illumination therefore appear in the lenses (particularly in the lenses of the lens group LG3, near the wafer), and have the following image errors as a consequence:

(a2) astigmatism on the axis
(c2) altered focal length (0.5 μm)
(e2) scale errors (1-5 ppm)
(f2) image shell (100 nm).

The quarter wave plate required for a beam splitter system is placed at a 45° angle to the axes of the scanner slit. Depending on the mounting of the rectangular quarter wave plate, astigmatism in the 45° direction also arises due to bending of the plate.

(a3) 45° astigmatism.

Compensation possibilities are:

For [a1], [g1], [a2], [a3]: Adaptive mirror. For [a1], [a2], and [a3], must be equipped with at least four actuators Ai (0° and 45° astigmatism). If only the dominant 0° astigmatism is corrected, two actuators Ai are sufficient. The actuators Ai are to be arranged pairwise symmetrically with respect to the optical axis.

[g1] since only a 0° fourfold wavefront-deformation is concerned because of the cube geometry, needs 4 actuators Ai in fourfold rotational symmetry to the optical axis, with collective driving.

i. Setting region of the actuators: −50 nm to +50 nm
ii. Resolution and stability: <1 nm.

[b1] is to be compensated with a centering lens (lens LX in his example) with radial mobility.

[c1], [d1], [c2]: Adjustment of the wafer 4 in the axial direction.

[e1], [h1], (e2), [f2]:
i. displacement of the reticle 3 in the axial direction and z-manipulators LZ1 for displacement of individual lenses LZ or lens groups in the z-direction (axial).

For the measurement of the image errors:

Image field displacement [d1], scale [e1, e2], focus position [c1, c2], astigmatism [a1, a2, a3] and image shell [f1, f2] can be determined in the stepper during operation, e.g., in the manner given in U.S. Pat. No. 5,142,132. Image errors of higher order must be either experimentally determined beforehand or else simulated (FE [finite element] calculations). Care must be taken that in measurements with test interferometers or with wavefront sensors of higher resolution, different operating modes of the objective (NA, σ, reticle transmission) behave differently. The behavior must then be stored in specific look-up tables in the memory of the control unit 20.

Figure 3:
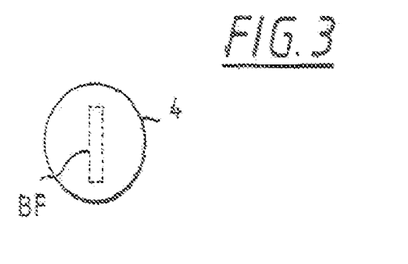
FIG. 3 shows schematically the image field of a wafer scanner.

FIG. 2 shows schematically in a top view of the concave mirror S2, the position of the zones of action (i.e., contact places) of the actuators Ai on the concave mirror S2 in a slit-shaped image field BF corresponding to FIG. 3. With four zones C and four zones B (i.e., at most eight contact places), the positions of the contact places (or zones of action of the actuators for zones B and zones C) are pairwise rotationally symmetric arms located every 45 degrees from the center. Zones C includes two pairs (or four) rotationally symmetric arms (i.e., four zones C with four arms) and zones B can include one pair of rotationally symmetric arms (two zones with two arms) or, as depicted in FIG. 2, can include two pairs of rotationally symmetric arms, i.e. four zones B with four arms.

The four zones B or C, placed in four fold rotational symmetry on the x- and y-axes, are suitable for compensating the fourfold wavefront-deformation. For this purpose, they are driven collectively, and deform the mirror S2, embodied as an elastic diaphragm, with four mutually symmetrical local extrema. The exact positions (radius) of the actuators Ai in the zones B or C, the displacement path, and the shape of the deformed surface, which are affected by its elasticity and the like, is to be matched in the individual objective 1 and the dimensioning of the image field BF. This is realized in the domain of optical design calculations and with finite element calculations.

Figure 4:
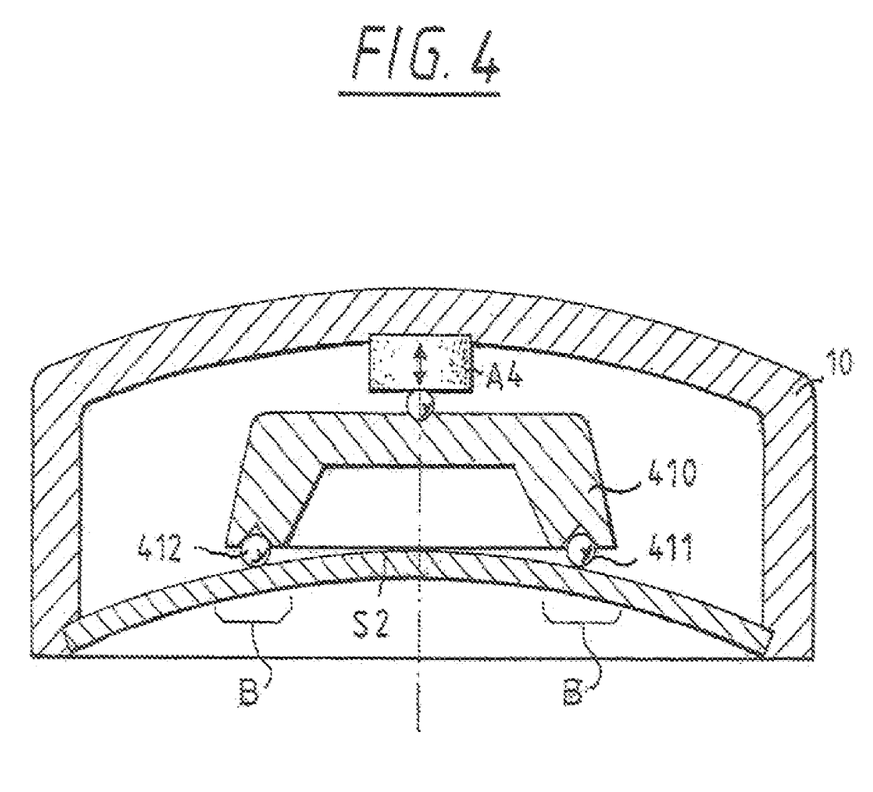
FIG. 4 shows schematically, in cross section, an adaptive minor with actuator, adjusting member, and several action points.

Since all the four zones B or C are collectively adjusted, it is possible according to FIG. 4 to provide only one actuator A4 which symmetrically deforms the concave mirror S2 in the zones B or C by means of a symmetrical bridge-shaped adjusting element 410, and which is embodied, for example, with presser balls 411, 412 (action places) for precise, moment-free force introduction. With only two arms, the adjusting element 410 could also act on the two zones B. With four arms, the adjusting element could act on four zones B. It should be noted that FIG. 4 depicts two arms schematically, and for simplification, does not depict the arms extending rough the plane of the Figure.

The zones A, likewise shown in FIG. 2, coinciding with two of the zones C, serve for the correction of astigmatism at 0° to the y-axis. The two zones B at 45° to the y-axis serve for the correction of astigmatism inclined at 45°. Here also, the actuators Ai are placed pairwise at the zones A or B, and the construction with adjusting elements corresponding to FIG. 4 is possible.

It is also advantageous to exert for astigmatism correction a pressure on the zones A and a tension on the two zones C transverse thereto (or vice versa).

Axial forces can be applied as shown, in the direction of the optical axis of the mirror S2, but also forces perpendicular thereto, intermediate and mixed forms and moments, in the mirror plane perpendicular to the optical axis. The actuators can also engage on the periphery of the mirror.

The solution according to the invention thus exhibits particular simplicity, since a certain few optical errors can be intentionally affected with few independent actuators. A true regulation is thereby possible, and also a purely feed-forward control. The invention can also be applied to overcompensation at an adjustable element, in order to preclude the error action of other elements anywhere in the projection exposure device. Fishing tolerances (scatter between units), lens heating and compaction, and also refractive index changes of the filling gas, etc., can be compensated. For the reduction of the adjustment path, a derivative action can be provided for the active mirror or in other parts of the system.

We claim:

1. A system, comprising:
 a microlithography projection objective having an optical axis, the microlithography projection objective comprising:
  a mirror having a mirror surface;
  a first adjusting element comprising a first actuator coupled to the mirror at a first location and a second location, the first and second locations being on opposing sides of the optical axis and the adjusting element being configured so that that during operation the first actuator deforms the mirror surface by applying a force to the mirror at the first and second locations; and
  a second adjusting element comprising a second actuator coupled to the mirror at a third location and a fourth location, the third and fourth locations being on opposing sides of the optical axis and being different from the first and second locations, and the second adjusting element being configured so that that during operation the second actuator deforms the mirror surface by applying a force to the mirror at the third and fourth locations.

2. The system of claim 1, wherein the first, second, third, and fourth locations are arranged symmetrically with respect to the optical axis.

3. The system of claim 1, wherein the first actuator is coupled to the mirror via a first element and a second element that contact the mirror at the first and second locations, respectively.

4. The system of claim 1, wherein the mirror surface is curved.

5. The system of claim 4, wherein the curved mirror surface is a concave surface.

6. The system of claim 1, wherein the microlithography projection objective is a catadioptric microlithography projection objective.

7. The system of claim 1, further comprising a control unit in communication with the adjusting element, wherein during operation the control unit causes the adjusting element to deform the mirror.

8. The system of claim 7, wherein the control unit causes the adjusting element to deform the mirror to correct imaging errors of the microlithography projection objective.

9. The system of claim 8, wherein the imaging errors comprise an astigmatism or a coma of the microlithography projection objective.

10. The system of claim 9, wherein the astigmatism or the coma of the microlithography projection objective are located on the optical axis.

11. The system of claim 8, further comprising a sensor in communication with the control unit, wherein during operation the sensor monitors an image formed by the microlithography projection objective.

12. The system of claim 11, wherein the control unit causes the adjusting element to deform the curved mirror based on the monitored image.

13. The system of claim 11, wherein the sensor comprises a wavefront sensor.

14. The system of claim 11, wherein the sensor comprises a camera or a CCD camera.

15. The system of claim 1, wherein the microlithography projection objective further comprises a plurality of optical elements configured with the mirror so that during operation the projection objective directs radiation from an object plane to an image plane of the microlithography projection objective.

16. The system of claim 15, wherein at least one of the plurality of optical elements is variable in position with respect to the optical axis.

17. The system of claim 16, wherein the position of the at least one optical element is variable axially along the optical axis.

18. The system of claim 16, wherein the position of the at least one optical element is variable transverse to the optical axis.

19. The system of claim 16, wherein the position of the at least one optical element is variable rotationally around the optical axis.

20. The system of claim 15, wherein the plurality of optical elements comprise at least one lens.

21. A system, comprising:
a microlithography projection objective having an optical axis, the microlithography projection objective comprising:
a mirror having a mirror surface;
a first adjusting element comprising a first actuator coupled to the mirror at two or more locations, the adjusting element being configured so that during operation the first actuator causes a first deformation in the mirror surface, the first deformation having twofold rotational symmetry, fourfold rotational symmetry, or superposition of twofold and fourfold symmetry; and
a second adjusting element comprising a second actuator coupled to the mirror at two or more locations different from the two or more locations coupled to the first actuator, the second adjusting element being configured so that during operation the second actuator causes a second deformation in the mirror surface, the second deformation having twofold rotational symmetry or fourfold rotational symmetry.

22. The system of claim 21, wherein during operation the first and second adjusting elements cause a deformation in the mirror surface having a superposition of twofold and fourfold rotational symmetry.

23. A method, comprising:
forming an image using a microlithography projection objective, the microlithography projection objective comprising a mirror; and
deforming the mirror to cause a deformation in a surface of the mirror that has twofold symmetry, fourfold symmetry, or a superposition of twofold and fourfold symmetry,
wherein the deformation corrects imaging errors of the microlithography projection objective and the imaging errors comprise an astigmatism or a coma of the microlithography projection objective.

24. The method of claim 23, wherein the astigmatism or the coma is on the optical axis.

25. The method of claim 24, wherein the astigmatism or the coma is constant on the optical axis.

26. The method of claim 23, wherein deforming the mirror comprises applying a force to a first location of the mirror and a second location of the mirror, the first and second locations being on opposing sides of an optical axis of the mirror.

27. The method of claim 23, wherein the deformation is based on a monitored parameter of the image.

28. The method of claim 27, wherein the monitored parameter of the image is an image field displacement, scale, focus position, astigmatism or image shell in the region of an image plane of the microlithography projection objective.

29. The method of claim 23, wherein the deformation is based on a monitored parameter of the microlithography projection objective.

30. The method of claim 29, wherein the monitored parameter of the microlithography projection objective is a numerical aperture of the microlithography projection objective, a type and degree of coherence of an illuminating device providing radiation to the microlithography projection objective, and properties of a mask whose image is formed by the microlithography projection objective.

31. A system, comprising:
a microlithography projection objective having an optical axis, the microlithography projection objective comprising:
a mirror having a mirror surface;
an a first adjusting element comprising an actuator coupled to the mirror at a first location and a second location, the first and second locations being on opposing sides of the optical axis and the adjusting element being configured so that during operation the actuator deforms the mirror surface by applying a force to the mirror at the first and second locations; and
a control unit in communication with the first adjusting element, wherein during operation the control unit causes the first adjusting element to deform the mirror to correct imaging errors of the microlithography projection objective,
wherein the imaging errors comprise an astigmatism or a coma of the microlithography projection objective.

32. The system of claim 31, wherein the microlithography projection objective is a catadioptric microlithography projection objective.

33. The system of claim 31, wherein the microlithography projection objective is a reduction objective.

34. The system of claim 31, wherein the microlithography objective is configured to have a rectangular image field during operation and the first adjusting element is configured to deform the mirror based on the image field shape.

35. The system of claim 31, further comprising a second adjusting element comprising an actuator coupled to the mirror at a third location and a fourth location, the third and fourth locations being on opposing sides of the optical axis and being different from the first and second locations, and the second adjusting element being configured so that that during operation the actuator of the second adjusting element deforms the curved mirror surface by applying a force to the mirror at the third and fourth locations.

36. A system, comprising:
a microlithography projection objective having an optical axis, the microlithography projection objective comprising:
a mirror having a mirror surface;
an a first adjusting element comprising an actuator coupled to the mirror at a first location and a second location, the first and second locations being on opposing sides of the optical axis and the adjusting element being configured so that that during operation the actuator deforms the mirror surface by applying a force to the mirror at the first and second locations;
a plurality of optical elements configured with the mirror so that during operation the projection objective directs radiation from an object plane to an image plane of the microlithography projection objective,
wherein at least one of the plurality of optical elements is variable axially, rotationally, or both axially and rotationally along the optical axis.

37. The system of claim 36, wherein the microlithography projection objective is a catadioptric microlithography projection objective.

38. The system of claim 36, wherein the microlithography projection objective is a reduction objective.

39. A system comprising:
a microlithography projection objective having an optival axis, the microlithography projection objective comprising:

a mirror having a surface;

a first adjusting element comprising an actuator coupled to the mirror at a first location and a second location, the first and second locations being on opposing sides of the optical axis and the adjusting element being configured so that that during operation the actuator deforms the mirror surface by applying a force to the mirror at the first and second locations;

a plurality of lenses configured with the mirror so that during operation the projection objective directs radiation from an object plane to an image plane of the microlithography projection objective;

a control unit in communication with the first adjusting element, wherein during operation the control unit causes the first adjusting element to deform the mirror to correct imaging errors caused by heating of the lenses;

and a second adjusting element comprising an actuator coupled to the mirror at a third location and a fourth location, the third and fourth locations being on opposing sides of the optical axis and being different from the first and second locations, and the second adjusting element being configured so that that during operation the actuator of the second adjusting element deforms the curved mirror surface by applying a force to the mirror at the third and fourth locations.

40. The system of claim 39, wherein the microlithography objective is configured to have a rectangular image field during operation.

41. The system of claim 40, wherein the control unit and adjusting element are configured to deform the mirror during operation to correct imaging errors caused by non-rotationally symmetric heating of the lenses.

* * * * *

UNITED STATES PATENT AND TRADEMARK OFFICE
CERTIFICATE OF CORRECTION

| | | |
|---|---|---|
| PATENT NO. | : 7,294,814 B2 | |
| APPLICATION NO. | : 11/533632 | |
| DATED | : November 13, 2007 | |
| INVENTOR(S) | : Christian Wagner, Michael Gerhard and Gerald Richter | |

It is certified that error appears in the above-identified patent and that said Letters Patent is hereby corrected as shown below:

Column 1, Line 66: Delete the word "pets" and replace it with -- permits --.

Column 2, Line 15: Delete the word "the" and replace it with -- than --.

Column 2, Line 53: Delete the word "minor" and replace it with -- mirror --.

Column 3, Line 6: Delete the word "is" and replace it with -- this --.

Column 3, Line 47: After the word "operation" and before the word "of" delete -- : --.

Column 4, Line 25: After "[a3]," and before the word "must" add -- this --.

Column 4, Line 37: Delete the word "his" and replace it with -- this --.

Column 5, Line 51: Delete the word "Fishing" and replace it with -- Finishing --.

Column 5, Line 67: Delete the second instance of the word "that".

Column 6, Line 9 Claim 1: Delete the word "that".

Column 8, Line 6 Claim 31: Delete the word "an".

Column 8, Line 10 Claim 31: Delete the second instance of the word "that".

Column 8, Line 35 Claim 35: Delete the second instance of the word "that".

Column 8, Line 44 Claim 36: Delete the word "an".

Column 8, Line 48 Claim 36: Delete the second instance of the word "that".

UNITED STATES PATENT AND TRADEMARK OFFICE
CERTIFICATE OF CORRECTION

PATENT NO. : 7,294,814 B2
APPLICATION NO. : 11/533632
DATED : November 13, 2007
INVENTOR(S) : Christian Wagner, Michael Gerhard and Gerald Richter It is certified that error appears in the above-identified patent and that said Letters Patent is hereby corrected as shown below:

Column 8, Line 65 Claim 39: Delete the word "optival" and replace it with -- optical --.

Column 9, Line 6 Claim 40: Delete the second instance of the word "that".

Column 10, Line 6 Claim 40: Delete the second instance of the word "that".

Signed and Sealed this

Eighteenth Day of November, 2008

JON W. DUDAS
*Director of the United States Patent and Trademark Office*